(12) United States Patent
Koduri

(10) Patent No.: US 11,064,615 B2
(45) Date of Patent: Jul. 13, 2021

(54) WAFER LEVEL BUMP STACK FOR CHIP SCALE PACKAGE

(71) Applicant: Texas Instruments Incorporated, Dallas, TX (US)

(72) Inventor: Sreenivasan K Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 22 days.

(21) Appl. No.: 16/588,220

(22) Filed: Sep. 30, 2019

(65) Prior Publication Data

US 2021/0100108 A1    Apr. 1, 2021

(51) Int. Cl.
*H05K 3/34* (2006.01)
*H05K 1/02* (2006.01)
*H05K 3/28* (2006.01)
*H05K 3/38* (2006.01)

(52) U.S. Cl.
CPC ......... *H05K 3/3421* (2013.01); *H05K 1/0234* (2013.01); *H05K 1/0269* (2013.01); *H05K 3/284* (2013.01); *H05K 3/3494* (2013.01); *H05K 3/386* (2013.01); *H05K 2201/068* (2013.01)

(58) Field of Classification Search
CPC .... H05K 3/3421; H05K 1/0269; H05K 3/386; H05K 1/0234; H05K 3/284; H05K 3/3494; H05K 2201/068
See application file for complete search history.

(56) References Cited

U.S. PATENT DOCUMENTS

| 6,341,070 | B1 | 1/2002 | Yu |
| 6,413,799 | B1 | 7/2002 | Lam |
| 7,192,847 | B2 | 3/2007 | Hsuan |
| 7,241,643 | B1 | 7/2007 | Kelkar et al. |
| 7,776,649 | B1 | 8/2010 | Fan |
| 8,501,543 | B1 | 8/2013 | Berry et al. |
| 9,418,926 | B1 * | 8/2016 | Fay ............... H01L 21/4853 |
| 10,009,992 | B2 | 6/2018 | Vrtis et al. |
| 2006/0079019 | A1 | 4/2006 | Kim |
| 2008/0119029 | A1 | 5/2008 | Caletka et al. |
| 2013/0082399 | A1 * | 4/2013 | Kim ..................... H01L 24/97 257/774 |
| 2013/0307155 | A1 * | 11/2013 | Mitsuhashi ............ H01L 25/50 257/761 |

(Continued)

*Primary Examiner* — Victor A Mandala
(74) *Attorney, Agent, or Firm* — Dawn Jos; Charles A. Brill; Frank D. Cimino

(57) ABSTRACT

A microelectronic device includes a die less than 300 microns thick, and an interface tile. Die attach leads on the interface tile are electrically coupled to die terminals on the die through interface bonds. The microelectronic device includes an interposer between the die and the interface tile. Lateral perimeters of the die, the interposer, and the interface tile are aligned with each other. The microelectronic device may be formed by forming the interface bonds and an interposer layer, while the die is part of a wafer and the interface tile is part of an interface lamina. Kerfs are formed through the interface lamina, through the interposer, and partway through the wafer, around a lateral perimeter of the die. Material is subsequently removed at a back surface of the die to the kerfs, so that a thickness of the die is less than 300 microns.

7 Claims, 18 Drawing Sheets

(56) References Cited

U.S. PATENT DOCUMENTS

| | | | |
|---|---|---|---|
| 2015/0214207 A1* | 7/2015 | Yoshida | H01L 25/18 438/109 |
| 2015/0318261 A1* | 11/2015 | Chung | H01L 21/561 257/774 |
| 2017/0198176 A1* | 7/2017 | Kamochi | B32B 3/08 |
| 2018/0301443 A1* | 10/2018 | Kim | H01L 25/50 |
| 2019/0088634 A1* | 3/2019 | Tsukiyama | H01L 25/18 |
| 2019/0122950 A1* | 4/2019 | Groothuis | H01L 23/3736 |
| 2019/0181121 A1* | 6/2019 | Odnoblyudov | H01L 23/3735 |
| 2019/0327827 A1* | 10/2019 | Chang | H01L 33/62 |
| 2020/0020668 A1* | 1/2020 | Kim | H01L 23/562 |
| 2020/0388572 A1* | 12/2020 | Aygun | H01L 21/486 |

\* cited by examiner

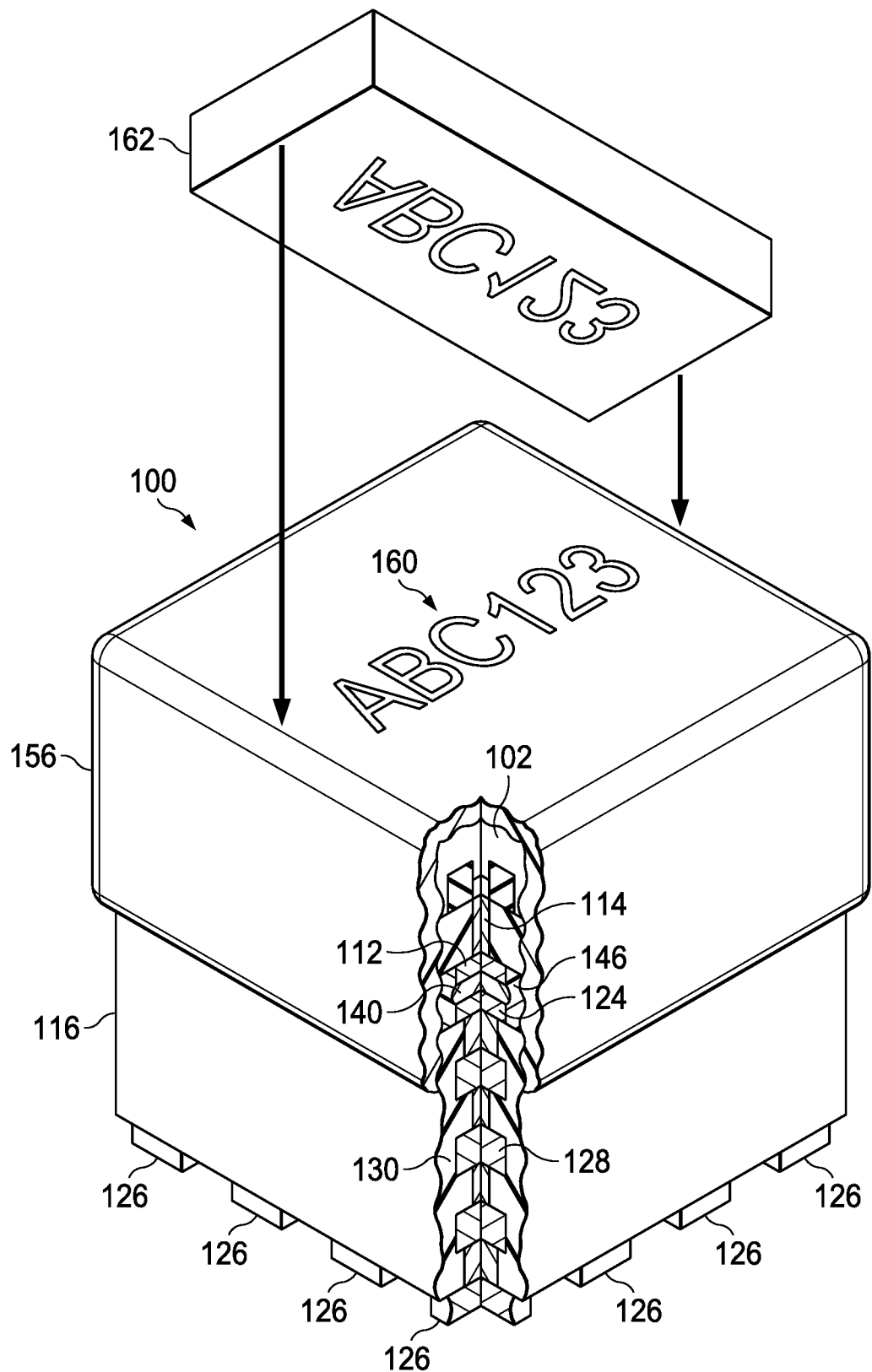
FIG. IJ

WAFER LEVEL BUMP STACK FOR CHIP SCALE PACKAGE

FIELD

This disclosure relates to the field of microelectronic devices. More particularly, this disclosure relates to chip scale packages of microelectronic devices.

BACKGROUND

Wafer chip scale packages that do not use lead frames or mold encapsulation provide small outline form factors for microelectronic devices. Wafer chip scale packages are commonly used in personal electronics. A major problem is reliability, due to the die of the microelectronic devices having very different coefficient of thermal expansion (CTE) than the CTE of the printed circuit boards (PCB) to which the microelectronic devices are attached. Electrical connections such as solder bumps between the die and the PCB may experience mechanical stress and failure due to the difference in thermal expansion between the die and the PCB during operation of the microelectronic device. Automotive, industrial and infrastructure applications need a more robust solution.

SUMMARY

A microelectronic device has a die with a terminal surface, and die terminals at the terminal surface. A thickness of the die is less than 300 microns. The microelectronic device includes an interface tile having a die attach surface, with die attach leads at the die attach surface. The die attach leads are electrically coupled to the die terminals through interface bonds. The interface tile has external leads at an external surface located opposite from the die attach surface. The external leads are electrically coupled to the die attach leads through interconnects in the interface tile. An interposer extends from the terminal surface of the die to the die attach surface of the interface tile. A lateral perimeter of the die, a lateral perimeter of the interposer, and a lateral perimeter of the interface tile are aligned with each other. The microelectronic device includes a die coating on the back surface and lateral surfaces of the die.

The microelectronic device may be formed by forming the interface bonds between the die attach leads and the die terminals, while the die is part of a wafer and the interface tile is part of an interface lamina. The interposer is formed between the terminal surface and the die attach surface, while the die is part of the wafer and the interface tile is part of the interface lamina. Kerfs are formed through the interface lamina, through the interposer, and partway through the wafer, around a lateral perimeter of the die. Material is subsequently removed at a back surface of the die to the kerfs, so that a thickness of the die is less than 300 microns.

BRIEF DESCRIPTION OF THE VIEWS OF THE DRAWINGS

FIG. 1A through FIG. 1J are cross sections of an example microelectronic device depicted in stages of an example method of formation.

DETAILED DESCRIPTION

Figure 1A:
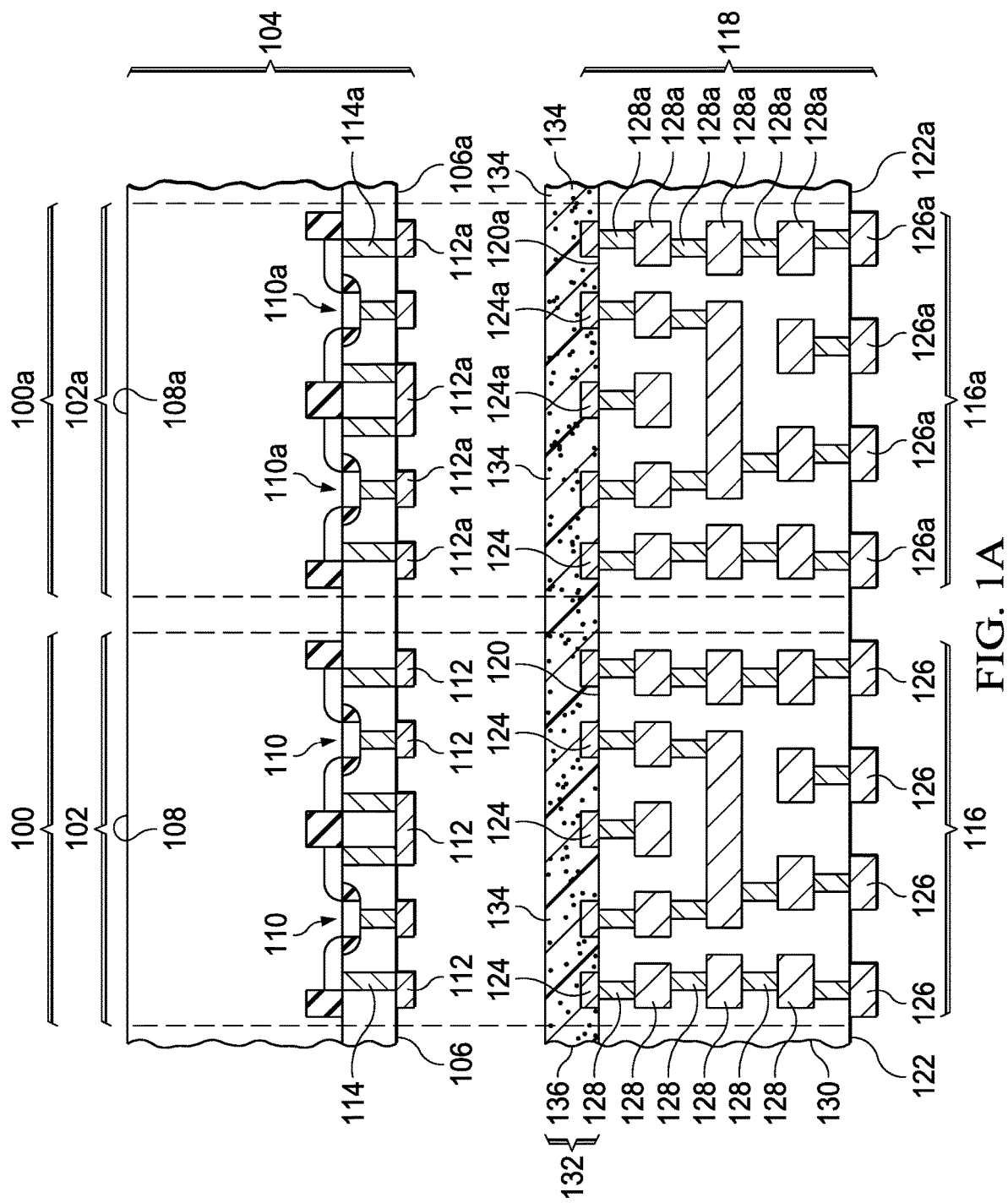

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A microelectronic device includes a die and an interface tile that is electrically coupled to the die. The die has a terminal surface and a back surface located opposite from the terminal surface. The die has die terminals at the terminal surface. The die terminals are electrically coupled to components in the die. A thickness of the die, from the terminal surface to the back surface, is less than 300 microns.

The interface tile has a die attach surface and an external surface located opposite from the die attach surface. The interface tile has die attach leads at the die attach surface, and has external leads at the external surface. The die attach leads provide connection nodes between the die terminals and the external leads. The external leads are electrically coupled to the die attach leads through interconnects in the interface tile. The die attach leads are electrically coupled to the die terminals through interface bonds. The interface tile thus provides an electrical and mechanical interface between the die and a substrate on which the microelectronic device is attached in use. The interface tile is rigid, that is, not compliant or flexible, with a Young's modulus of the interface tile being between a Young's modulus of the die and $25 \times 10^9$ pascal, that is 25 gigapascal or GPa, and a Young's modulus of a substrate, such as a printed circuit board, to which the completed microelectronic device is attached. Typical materials used for the die, such as silicon, sapphire, or gallium nitride, have Young's modulus values greater than 120 GPa, while printed circuit boards commonly have Young's modulus values below 40 GPa. A coefficient of thermal expansion (CTE) of the interface tile is greater than a CTE of the die and is less than $15 \times 10^{-6}/°$ K. Typical materials used for the die have CTE values less than $5 \times 10^{-6}/°$ K. Printed circuit boards commonly have CTE values above $15 \times 10^{-6}/°$ K. Having the Young's modulus and the CTE of the interface tile being between values of the die and values common substrate materials may advantageously reduce stress in the interface bonds, compared to directly die directly attached to substrates through solder bump bonds or die with flexible, compliant interface elements.

An interposer, which is electrically nonconductive, extends from the terminal surface of the die to the die attach surface of the interface tile. A lateral perimeter of the die, a lateral perimeter of the interposer, and a lateral perimeter of the interface tile are aligned with each other. The microelectronic device includes a die coating on the back surface and lateral surfaces of the die.

The term "electrically coupled" as used in this disclosure refers to elements that are coupled through electrically conductive elements that can support a direct current (DC) operation, such as metal lines, resistors, diodes, and such. The terms "laterally" and "lateral" refer to directions parallel to the terminal surface or the die attach surface, as appropriate.

The microelectronic device may be formed by providing a wafer containing the die of the microelectronic device and additional die, and by providing an interface lamina containing the interface tile of the microelectronic device and additional interface tiles. The wafer is attached to the interface lamina by the interface bonds. The interposer is formed between the terminal surface and the die attach surface, while the die is part of the wafer and the interface tile is part of the interface lamina. The interface lamina and the interposer are cut around a lateral perimeter of the die to form kerfs which extend through the interface lamina and partway through the wafer, and separate the interface tile from the additional interface tiles. Material is removed at the back surface of the die to the kerfs, so that the thickness of the die is less than 300 microns, and the die of the microelectronic device is separated from the additional die. The die coating subsequently is formed on the back surface and lateral surfaces of the die.

FIG. 1A through FIG. 1J are cross sections of an example microelectronic device depicted in stages of an example method of formation. Referring to FIG. 1A, the microelectronic device 100 includes a die 102 which is part of a wafer 104 containing the die 102 and an additional die 102a. The additional die 102a may be part of an additional microelectronic device 100a. The die 102 may be implemented as an integrated circuit, a discrete semiconductor device, a microelectrical mechanical system (MEMS) device, an electro-optical device, or a microfluidics device, for example. Other implementations for the die 102 are within the scope of this example. The additional die 102a may have a same design and configuration as the die 102 of the microelectronic device 100, or may have a different design or configuration. The wafer 104 may be implemented as a semiconductor wafer, such as a bulk silicon wafer, a silicon wafer with a silicon epitaxial layer, a silicon on insulator (SOI) wafer, or a semiconductor wafer with a III-V epitaxial layer, for an integrated circuit, a discrete semiconductor device, or an electro-optical device. Alternatively, the wafer 104 may be implemented as a glass or sapphire wafer for a MEMS device, or a glass or polymer wafer for a microfluidics device. Other implementations for the wafer 104 are within the scope of this example. The die 102 has a terminal surface 106, and a back surface 108 located opposite from the terminal surface 106. Similarly, the additional die 102a has a terminal surface 106a that is coplanar with the terminal surface 106, and a back surface 108a, located opposite from the terminal surface 106a and coplanar with the back surface 108. The die 102 includes one or more components 110. Similarly, the additional die 102a includes one or more components 110a. The components 110 and 110a are depicted in FIG. 1A as metal oxide semiconductor (MOS) transistors, but may be implemented as other types of transistors, diodes, electro-optical components such as lasers or photodetectors, MEMS components such as accelerometers or pressure sensors, or microfluidics components such as droplet generators or mixers. Other implementations of the components 110 and 110a are within the scope of this example. The die 102 has die terminals 112 at the terminal surface 106. The die terminals 112 may be implemented as bump pads or pillars, for example, and may include aluminum, copper, nickel, palladium, platinum, tungsten, or gold. The die terminals 112 are electrically coupled to the components 110, for example, through contacts 114 in the die 102, or other electrically conductive interconnection elements. Similarly, the additional die 102a has die terminals 112a at the terminal surface 106a. The die terminals 112a are electrically coupled to the components 110a, in a similar configuration to the die 102, such as through contacts 114a.

The microelectronic device 100 includes an interface tile 116 which is part of an interface lamina 118 that contains the interface tile 116 and an additional interface tile 116a. The additional interface tile 116a may be part of the additional microelectronic device 100a. The interface tile 116 has a die attach surface 120 and an external surface 122 located opposite from the die attach surface 120. Similarly, the additional interface tile 116a has a die attach surface 120a that is coplanar with the die attach surface 120, and has an external surface 122a, located opposite from the die attach surface 120a and coplanar with the external surface 122. The interface tile 116 includes die attach leads 124 at the die attach surface 120, and includes external leads 126 at the external surface 122. The die attach leads 124 are electrically coupled to the external leads 126 through interconnects 128 in the interface tile 116. The interconnects 128 may include both vertical and lateral elements, as depicted in FIG. 1A. The term "vertical" refers to a direction perpendicular to the die attach surface 120. The die attach leads 124 and the external leads 126 are electrically conductive, and may include copper, aluminum, gold, stainless steel, nickel, tungsten, molybdenum, or titanium, and may have coatings of gold, nickel, palladium, cobalt, platinum, or tungsten, by way of example. The interconnects 128 are electrically conductive, and may include copper, aluminum, gold, tungsten, nickel, or palladium, by way of example. The interconnects 128 may couple more than one of the die attach leads 124 to one of the external leads 126, and may couple more than one of the external leads 126 to one of the die attach leads 124. An instance of the external leads 126 may be laterally displaced from an instance of the die attach leads 124 to which it is electrically coupled through the interconnects 128. The additional interface tile 116a similarly includes die attach leads 124a at the die attach surface 120a, and includes external leads 126a at the external surface 122a, with interconnects 128a electrically coupling the die attach leads 124a to the external leads 126a. The interconnects 128 and 128a are laterally surrounded by a lamina structure 130. The lamina structure 130 extends from the die attach surfaces 120 and 120a to the external surfaces 122 and 122a. The lamina structure 130 is electrically non-conductive, and may include, for example, fiberglass reinforced polymer or ceramic. A CTE of the interface tile 116 is greater than a CTE of the die 102 and less than $15 \times 10^{-6}/°$K.

An anisotropic solder film 132 is formed on the die attach surfaces 120 and 120a of the wafer 104, covering the die attach leads 124 and 124a. The anisotropic solder film 132 has solder particles 134 dispersed in a plastic material 136. The solder particles 134 may include a mixture of metals such as tin, bismuth, silver, zinc, or copper. The plastic material 136 may be implemented with a thermoplastic or a thermosetting plastic. The anisotropic solder film 132 may have a thickness of 10 microns to 50 microns, by way of example. In an alternate version of this example, the anisotropic solder film 132 may be formed on the die attach surfaces 120 and 120a of the interface lamina 118, covering the die attach leads 124 and 124a.

Figure 1B:
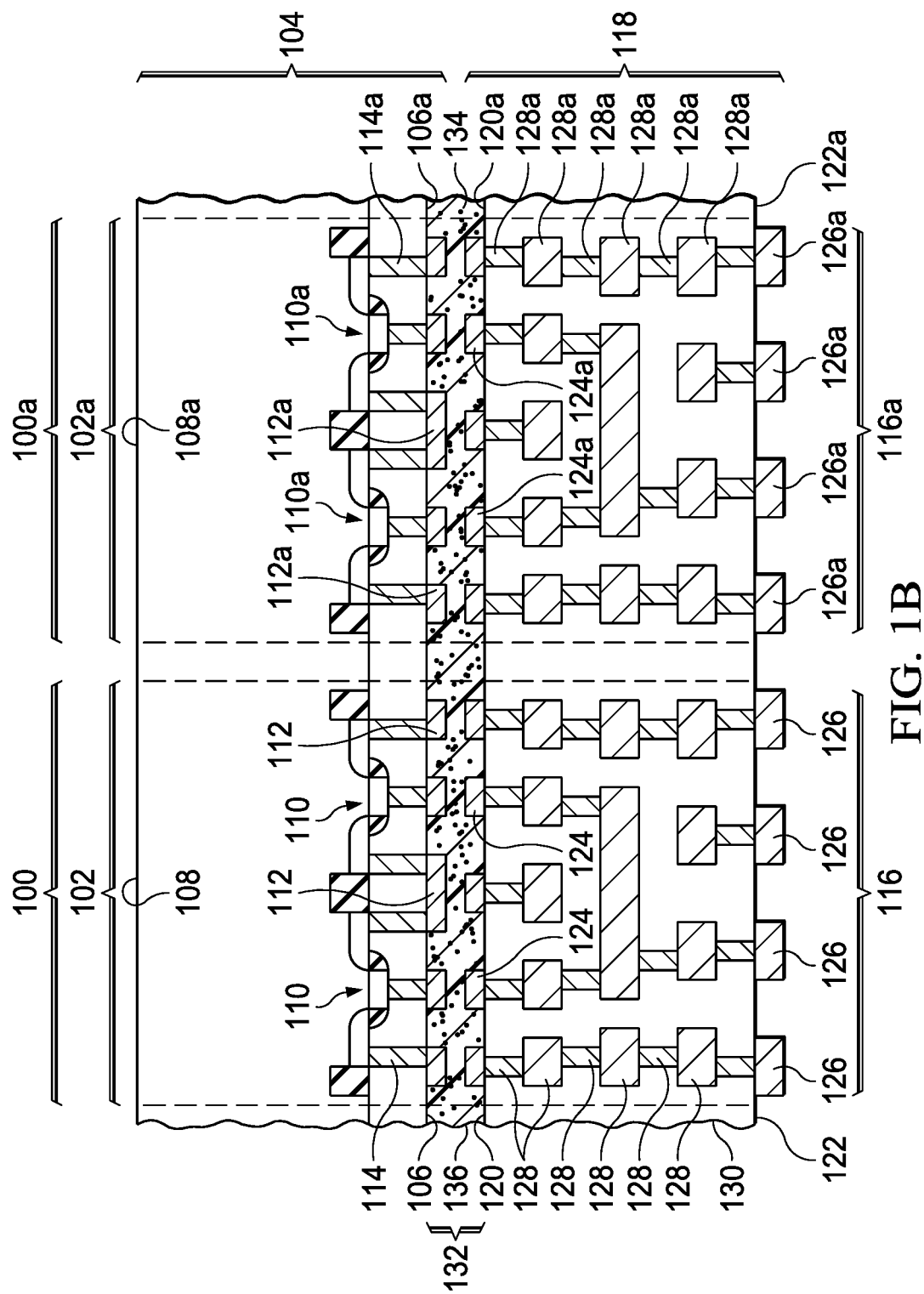

Referring to FIG. 1B, the interface lamina 118 is brought into contact with the anisotropic solder film 132. The anisotropic solder film 132 contacts the die attach leads 124 and 124a. The die attach leads 124 and 124a are aligned with the die terminals 112 and 112a, respectively. Air or other ambient gas may be removed from between the terminal surfaces 106 and 106a and the die attach surfaces 120 and 120a, so that the anisotropic solder film 132 fills a space between the terminal surfaces 106 and 106a and the die attach surfaces 120 and 120a, as depicted in FIG. 1B.

Figure 1C:
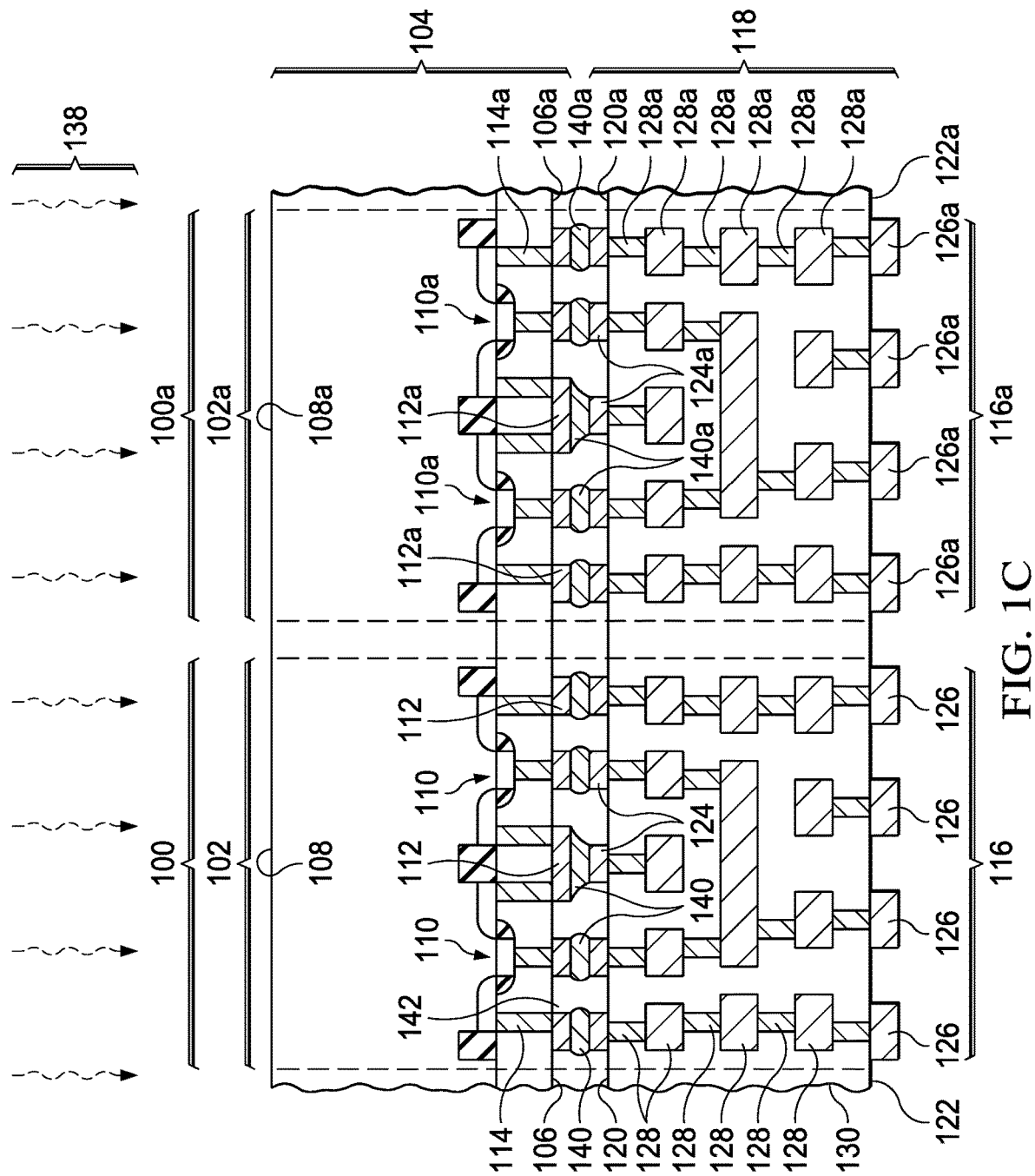

Referring to FIG. 1C, the anisotropic solder film 132 of FIG. 1B is heated by a heating process 138 which melts the solder particles 134 of FIG. 1B and reduces a viscosity of the plastic material 136 of FIG. 1B. The solder particles 134 diffuse and aggregate to form interface bonds 140 which electrically couple the die attach leads 124 to the die terminals 112, and form interface bonds 140a which electrically couple the die attach leads 124a to the die terminals 112a. The plastic material 136 laterally surrounds the interface bonds 140 and 140a. The heating process 138 may be implemented as a radiant heating process, a convection heating process, or a hot plate heating process, by way of example. The heating process 138 may heat the anisotropic solder film 132 to 140° C. for 4 minutes, to 180° C. for 60 seconds, by way of example. In versions of this example in which the plastic material 136 is implemented as a thermoplastic, the plastic material 136 may remain in a fluid state during the heating process 138. In other versions of this example in which the plastic material 136 is implemented as a thermosetting plastic, the plastic material 136 may harden to a solid state during the heating process 138 to form an interposer layer 142. Subsequently, the anisotropic solder film 132 is cooled, solidifying the interface bonds 140 and 140a. In versions of this example in which the plastic material 136 is implemented as a thermoplastic, the plastic material 136 hardens after the heating process 138 is completed to form the interposer layer 142. The interposer layer 142 laterally surrounds the interface bonds 140 and 140a.

In an alternate version of this example, an anisotropic conductive paste layer may be formed on the wafer 104 or the interface lamina 118, the anisotropic conductive paste layer containing electrically conductive particles and an adhesive. The interface lamina 118 and the wafer 104 are pressed together, so that the electrically conductive particles electrically couple the interface leads with the die terminals, providing the interface bonds 140 and 140a. The anisotropic conductive paste layer is heated to cure the adhesive to form the interposer layer 142.

Figure 1D:
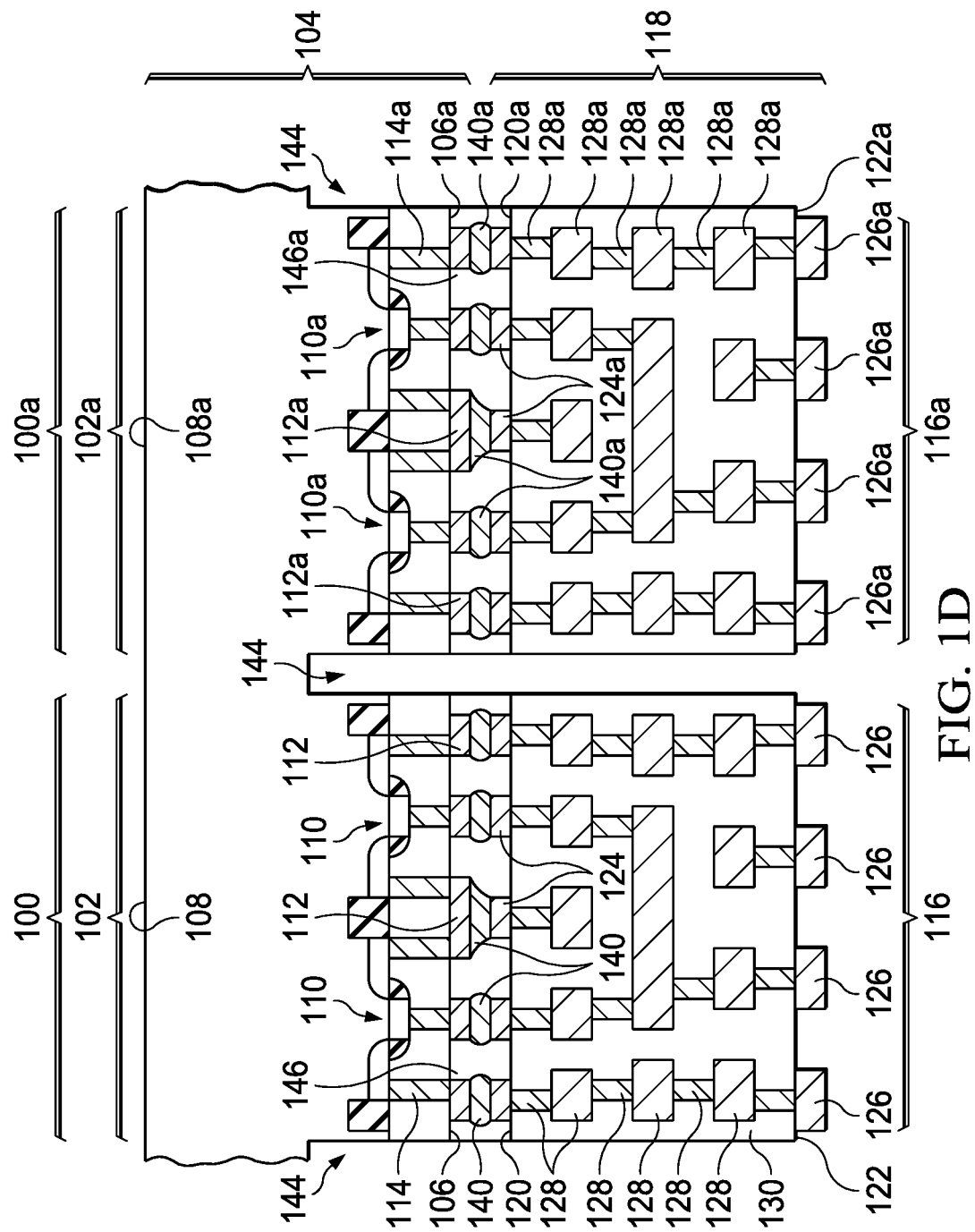

Referring to FIG. 1D, kerfs 144 are formed through the interface lamina 118, the interposer layer 142 of FIG. 1C, and partway through the wafer 104 around a lateral perimeter of the die 102, and around lateral perimeters of the additional die 102a. The kerfs 144 may be formed by a saw process. Alternatively, the kerfs 144 may be formed by a laser ablation process to form the kerfs 144 through the interface lamina 118 followed by a plasma etch process to form the kerfs 144 partway through the wafer 104. The interposer layer 142 may advantageously prevent contamination from the process of forming the kerfs 144, such as saw debris, from depositing on the terminal surface 106 of the die 102, the die attach surface 120 of the interface tile 116, and the interface bonds 140. The kerfs 144 may have widths of 20 microns to 100 microns, by way of example. The kerfs 144 extend into the wafer 104 to a depth that is at least as much as a desired final thickness of the die 102 in the completed microelectronic device 100. Forming the kerfs 144 singulates the interface tile 116 from the interface lamina 118. Forming the kerfs 144 also singulates the interposer layer 142 to form an interposer 146 of the microelectronic device 100, and forms additional interposers 146a of the additional microelectronic devices 100a. The interposer 146 extends from the die attach surface 120 of the interface tile 116 to the terminal surface 106 of the die 102. Forming the kerfs 144 results in a lateral perimeter of the interface tile 116, a lateral perimeter of the interposer 146, and the lateral perimeter of the die 102 being aligned to each other.

Figure 1E:
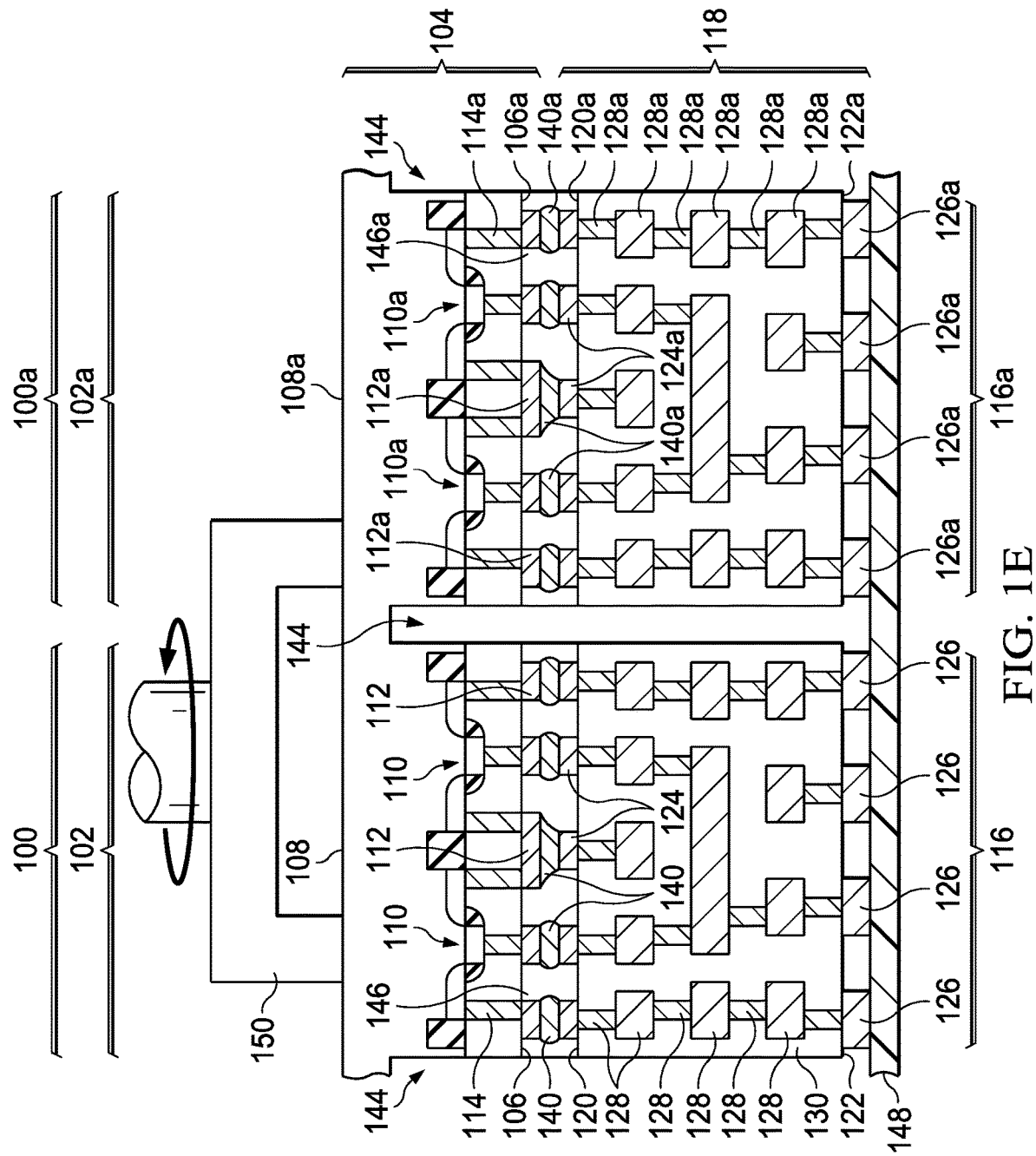

Referring to FIG. 1E, the interface lamina 118 is mounted on a carrier 148. The carrier 148 may be implemented as a thermal release tape or an ultraviolet (UV) release tape, by way of example. Material is removed from the wafer 104 at the back surfaces 108 and 108a. The material may be removed from the wafer 104 by a back grind process using an abrasive grinding head 150, as depicted in FIG. 1E. Other methods of removing the material from the wafer 104 are within the scope of this example. FIG. 1E depicts removal of the material from the wafer 104 partway to completion. The material is removed from the wafer 104 at the back surfaces 108 and 108a until the kerfs 144 are exposed, singulating the die 102 from the additional die 102a.

Figure 1F:
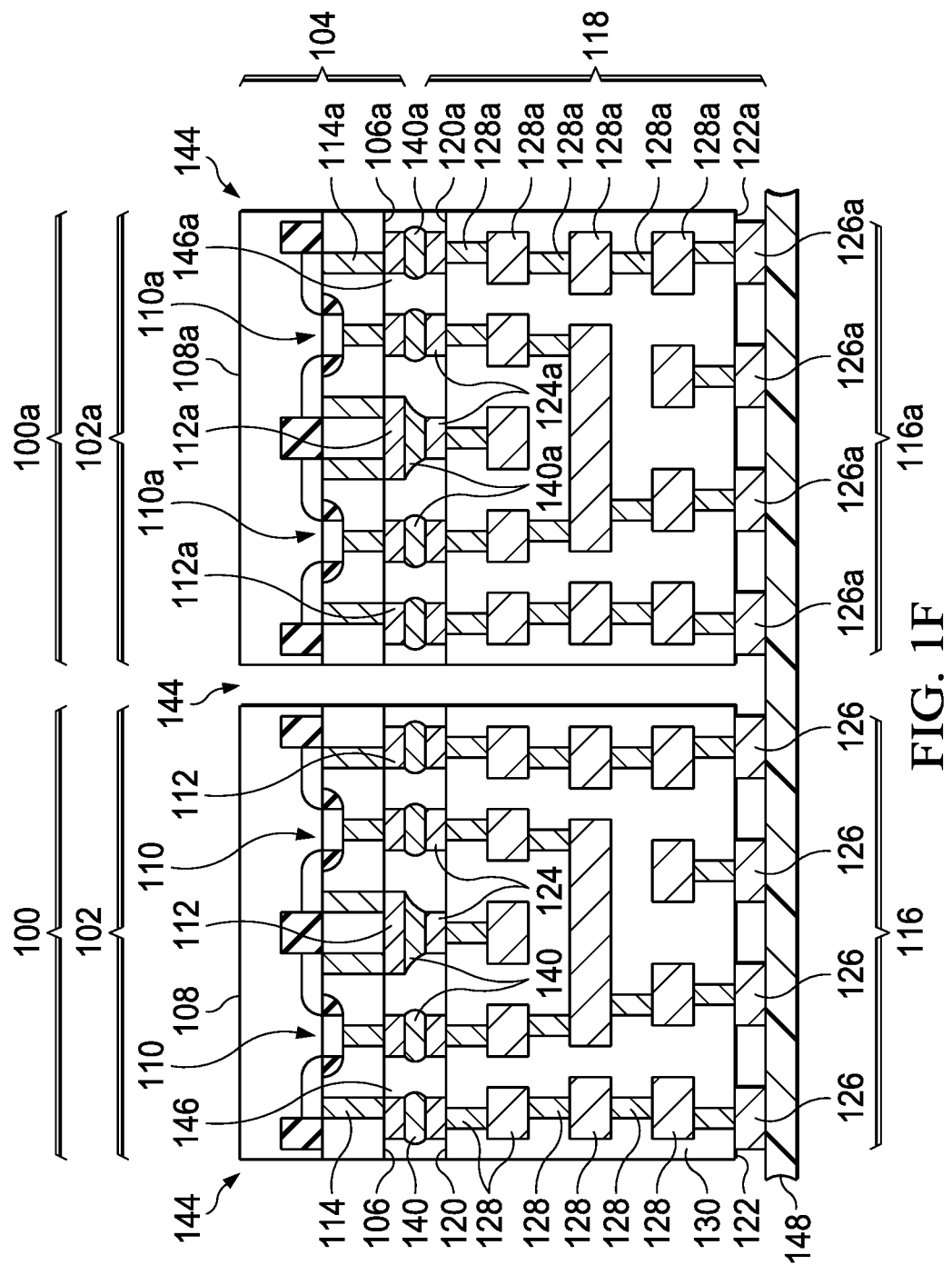

FIG. 1F depicts the microelectronic device 100 after removal of the material from the wafer 104 is completed. The microelectronic device 100 has been singulated from the additional microelectronic device 100a by removal of the material from the wafer 104 up to the kerfs 144. A thickness of the die 102, from the terminal surface 106 to the back surface 108, is less than 300 microns. The microelectronic device 100 and the additional microelectronic device 100a may be left on the carrier 148 for subsequent formation operations. The thickness of the die 102 may be selected to provide sufficient mechanical durability during fabrication, while attaining an advantage of reducing mechanical stress on the interface bonds 140, due to differences in thermal expansion between the die 102 and a printed circuit board or other substrate, with a CTE higher than $15 \times 10^{-6}$/° K, to which the completed microelectronic device 100 is attached, during operation of the microelectronic device 100.

Figure 1G:
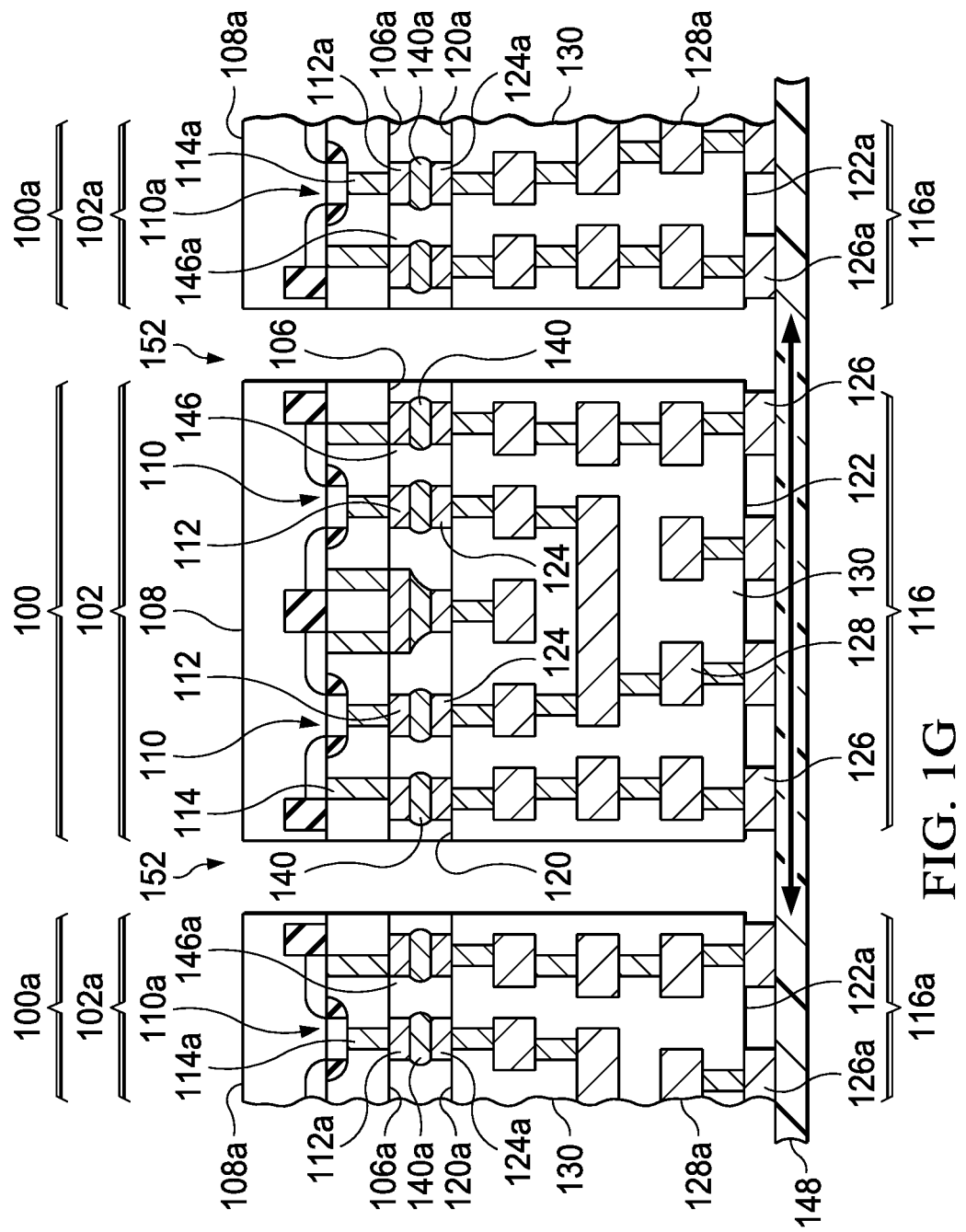

Referring to FIG. 1G, the carrier 148 may be expanded to increase lateral separations 152 between the microelectronic device 100 and the additional microelectronic device 100a. The lateral separations 152 may have values of 100 microns to 300 microns, for example. The carrier 148 may be expanded on a frame or using another apparatus.

Figure 1H:
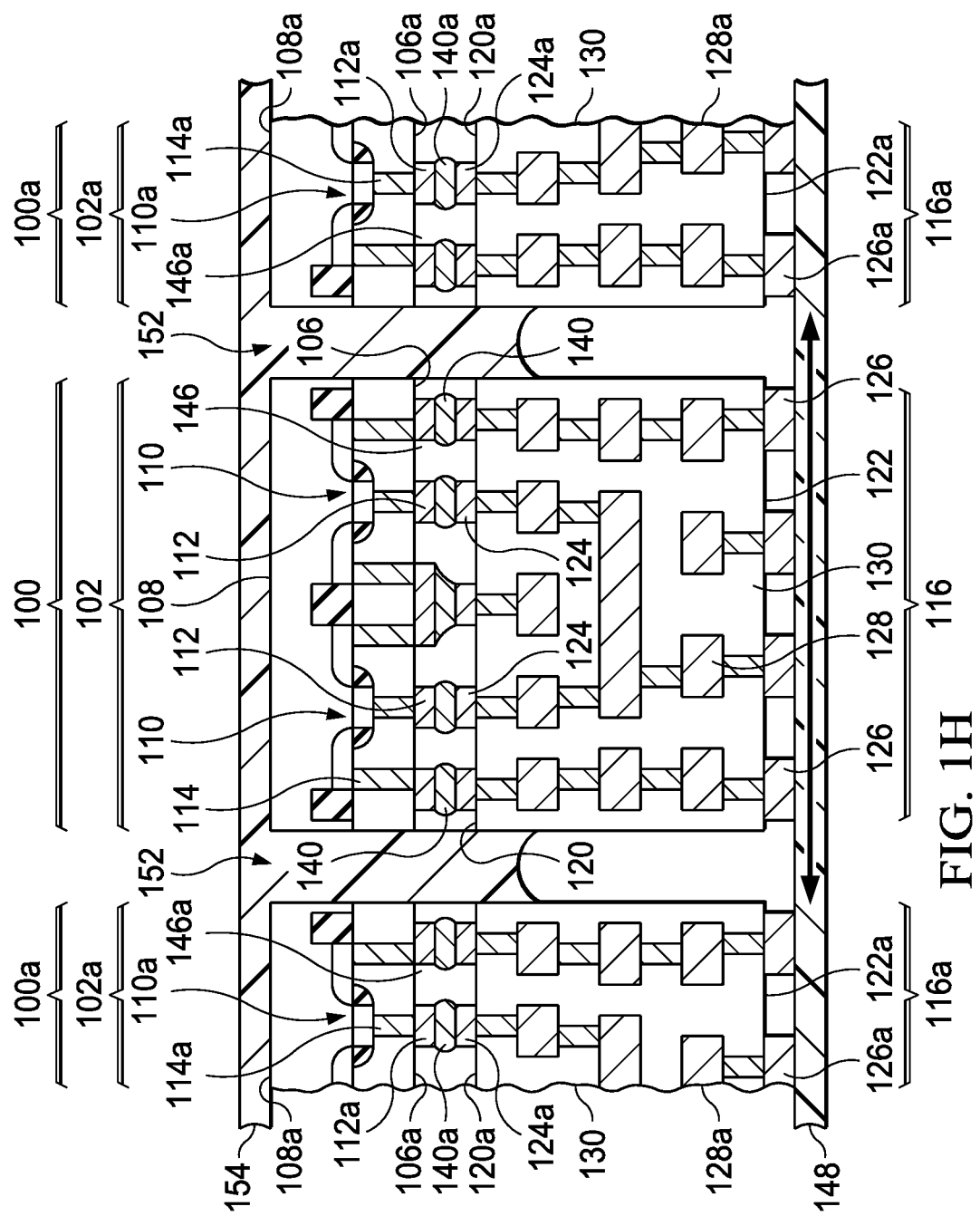

Referring to FIG. 1H, a coating ink 154 is applied to the back surfaces 108 and 108a of the die 102 and the additional die 102a, respectively. The coating ink 154 may be applied by a spray process, a roller process, a screen printing process, or an ink jet printing process, by way of example. The coating ink 154 includes opaque, electrically non-conductive pigment which adheres to the die 102 and the additional die 102a. The coating ink 154 wicks into the lateral separations 152 between the microelectronic device 100 and the additional microelectronic device 100a, to coat lateral sides of the die 102 and the additional die 102a. The coating ink 154 may be applied to the back surfaces 108 and 108a in a dosed amount, to provide a sufficient amount of the coating ink 154 to cover the lateral sides of the die 102 and the additional die 102a, without filling the lateral separations 152 between the microelectronic device 100 and the additional microelectronic device 100a.

Figure 1I:
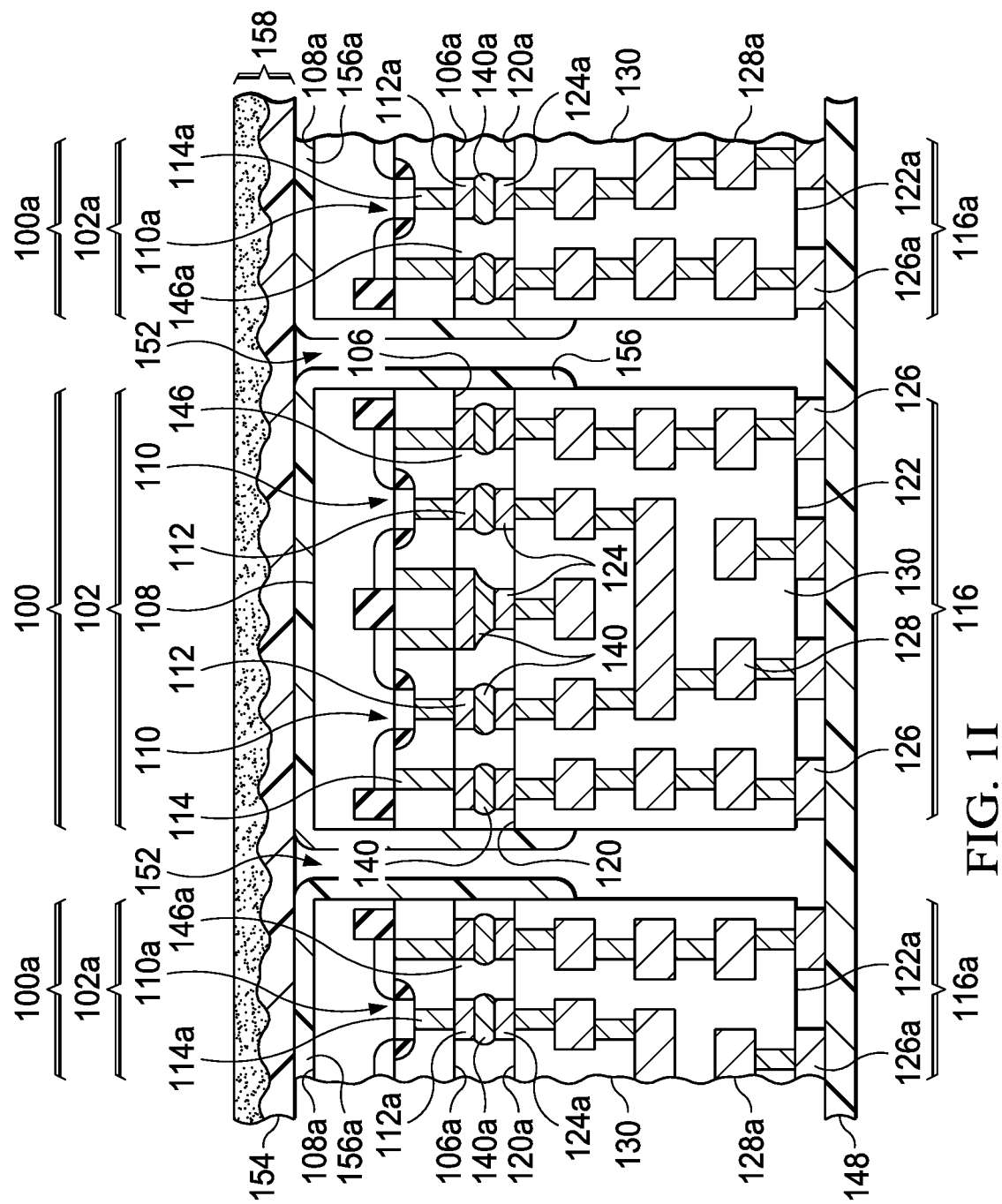

Referring to FIG. 1I, excess coating ink 154 may be removed from the back surfaces 108 and 108a of the die 102 and the additional die 102a, and from the lateral separations 152 between the microelectronic device 100 and the additional microelectronic device 100a, leaving the opaque, electrically non-conductive pigment on the die 102 and the additional die 102a to form a die coating 156 on the die 102 and form die coatings 156a on the additional die 102a. The excess coating ink 154 may be removed by contacting the coating ink 154 with an absorbent material 158 such as a blotter sheet or sponge sheet. The excess coating ink 154 may be absorbed into the absorbent material 158, as indicated in FIG. 1I. The die coating 156 may cover lateral sides of the die 102, extending partway onto the interface tile 116, as depicted in FIG. 1I. Expanding the carrier 148 as disclosed in reference to FIG. 1G may improve a process latitude for removing the excess coating ink 154.

Referring to FIG. 1J, the microelectronic device 100 may be removed from the carrier 148 of FIG. 1I. The microelectronic device 100 may be symbolized by forming characters 160 to the die coating 156. The characters 160 may include alphanumeric characters, as depicted in FIG. 1J, or may include other symbols indicating identity or status of the microelectronic device 100. The characters 160 may be formed by a symbolization apparatus 162, which may be implements as an inking stamp, an inking needle, or other marking device.

Having the CTE of the interface tile 116 greater than the CTE of the die 102 and less than $15 \times 10^{-6}/°$ K may advantageously reduce mechanical stress in the interface bonds 140 due to differences in thermal expansion between the die 102 and a printed circuit board or other substrate, with a CTE higher than $15 \times 10^{-6}/°$ K, to which the completed microelectronic device 100 is attached. Printed circuit boards commonly have CTEs greater than $15 \times 10^{-6}/°$ K. Having the thickness of the die 102 less than 300 microns may further reduce mechanical stress in the interface bonds 140, compared to a similar microelectronic device with a die having an original thickness of a semiconductor wafer containing the die, which may be more than 500 microns.

Figure 2A:
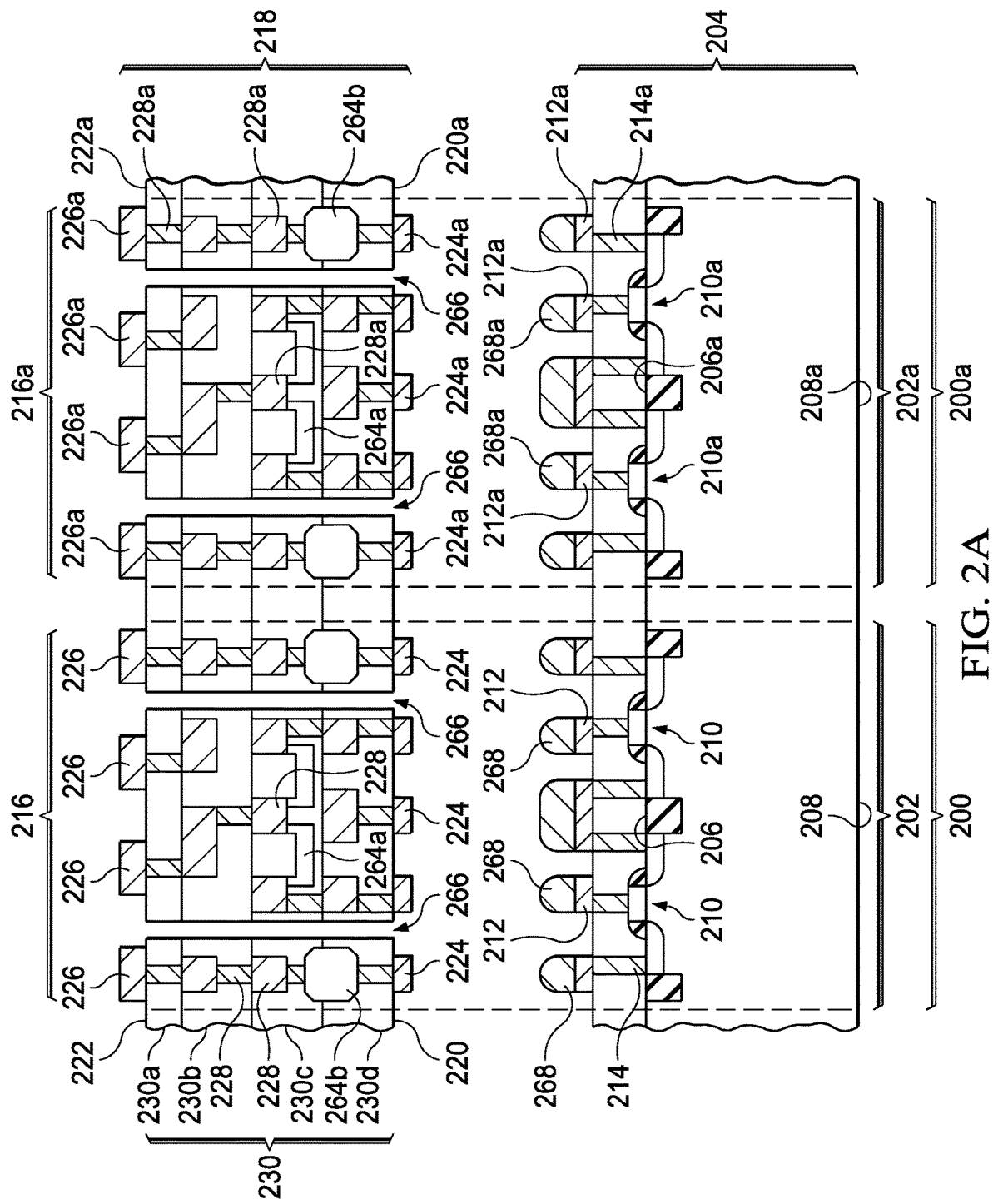
FIG. 2A through FIG. 2H are cross sections of another example microelectronic device depicted in stages of another example method of formation.

FIG. 2A through FIG. 2H are cross sections of another example microelectronic device depicted in stages of another example method of formation. Referring to FIG. 2A, the microelectronic device 200 includes a die 202 which is part of a wafer 204 containing the die 202 and an additional die 202a. The additional die 202a is part of an additional microelectronic device 200a. The die 202 and the additional die 202a have a terminal surface 206 and a terminal surface 206a, respectively, that are coplanar with each other. The die 202 and the additional die 202a have a back surface 208 and a back surface 208a, respectively, that are coplanar with each other and located opposite from the terminal surface 206 and the terminal surface 206a, respectively. The die 202 includes one or more components 210, and the additional die 202a includes one or more components 210a. The die 202 has die terminals 212 at the terminal surface 206, and the additional die 202a has die terminals 212a at the terminal surface 206a. The die terminals 212 and 212a may be implemented as bump pads or pillars. The die terminals 212 are electrically coupled to the components 210, and the die terminals 212a are electrically coupled to the components 210a. The die terminals 212 and 212a may be electrically coupled to the components 210 and the components 210a through contacts 214 and 214a, respectively, or through other interconnection elements.

The microelectronic device 200 includes an interface tile 216 which is part of an interface lamina 218 that contains the interface tile 216 and an additional interface tile 216a. The additional interface tile 216a is part of the additional microelectronic device 200a. The interface tile 216 has a die attach surface 220, and the additional interface tile 216a has a die attach surface 220a; the die attach surface 220 and the die attach surface 220a are coplanar. The interface tile 216 has an external surface 222 located opposite from the die attach surface 220, and the additional interface tile 216a has an external surface 222a, located opposite from the die attach surface 220a; the external surface 222 and the external surface 222a are coplanar. The interface tile 216 includes die attach leads 224 at the die attach surface 220, and includes external leads 226 at the external surface 222. The die attach leads 224 are electrically coupled to the external leads 226 through interconnects 228 in the interface tile 216. The die attach leads 224, the interconnects 228, and the external leads 226 are electrically conductive. The interface tile 216 may include components such as resistors 264a and diodes 264b. Other types of components in the interface tile 216 are within the scope of this example. The additional interface tile 216a similarly includes die attach leads 224a at the die attach surface 220a, and includes external leads 226a at the external surface 222a, with interconnects 228a electrically coupling the die attach leads 224a to the external leads 226a. The additional interface tile 216a includes the same components 264a and 264b as the interface tile 216.

The interconnects 228 and 228a are laterally surrounded by a lamina structure 230. The lamina structure 230 extends from the die attach surfaces 220 and 220a to the external surfaces 222 and 222a. The lamina structure 230 is electrically non-conductive. In this example, the lamina structure 230 may include two or more sub-laminae, such as a first sub-lamina 230a extending to the external surfaces 222 and 222a, a second sub-lamina 230b on the first sub-lamina 230a, a third sub-lamina 230c on the second sub-lamina 230b, and a fourth sub-lamina 230d on the third sub-lamina 230c and extending to the die attach surfaces 220 and 220a. The first sub-lamina 230a, the second sub-lamina 230b, the third sub-lamina 230c, and the fourth sub-lamina 230d may have decreasing values of CTE, so that an average CTE of the interface tile is greater than a CTE of the die and less than $10 \times 10^{-6}/°$ K, a CTE of the interface tile at the die attach surface is less than the average CTE of the interface tile and greater than a CTE of the die, and a CTE of the interface tile at the external surface is greater than the average CTE of the interface tile and less than $15 \times 10^{-6}/°$ K. This may be attained, by way of example, by having a CTE of $10 \times 10^{-6}/°$ K to $15 \times 10^{-6}/°$ K for the first sub-lamina 230a, down to a CTE of 100 percent to 150 percent of a CTE of the die 202 for the fourth sub-lamina 230d. The lamina structure 230 may include fiberglass reinforced polymer, with the fourth sub-lamina 230d having more fiberglass than the third sub-lamina 230c, the third sub-lamina 230c having more fiberglass than the second sub-lamina 230b, and the second sub-lamina 230b having more fiberglass than the first sub-lamina 230a. Having decreasing CTE values in the lamina structure 230 may advantageously reduce mechanical stress in the die 202 due to thermal expansion when the completed microelectronic device 200 is attached to a printed circuit board or other substrate with a CTE higher than $15 \times 10^{-6}/°$ K.

The interface lamina 218 may have access ports 266 extending through the lamina structure 230 from the external surfaces 222 and 222a to the die attach surfaces 220 and 220a. The access ports 266 are large enough to enable flow of a fluid precursor for a subsequently-formed interposer layer 242, shown in FIG. 2C.

Connection bumps 268 and 268a are formed on the die terminals 212 and 212a, respectively. In one version of this example, the connection bumps 268 and 268a may include a solder, and may be formed by dispensing solder paste onto the die terminals 212 and 212a, followed by a reflow operation to remove volatile material from the solder paste and reflow the solder to implement the connection bumps 268 and 268a as solder bumps. In another version of this example, the connection bumps 268 and 268a may include an electrically conductive adhesive, and may be formed by dispensing the electrically conductive adhesive onto the die terminals 212 and 212a. In an alternate version of this example, the connection bumps 268 and 268a may be formed on the die attach leads 224 and 224a, rather than on the die terminals 212 and 212a. In a further version, the connection bumps 268 and 268a may be formed on the die attach leads 224 and 224a, and on the die terminals 212 and 212a.

Figure 2B:
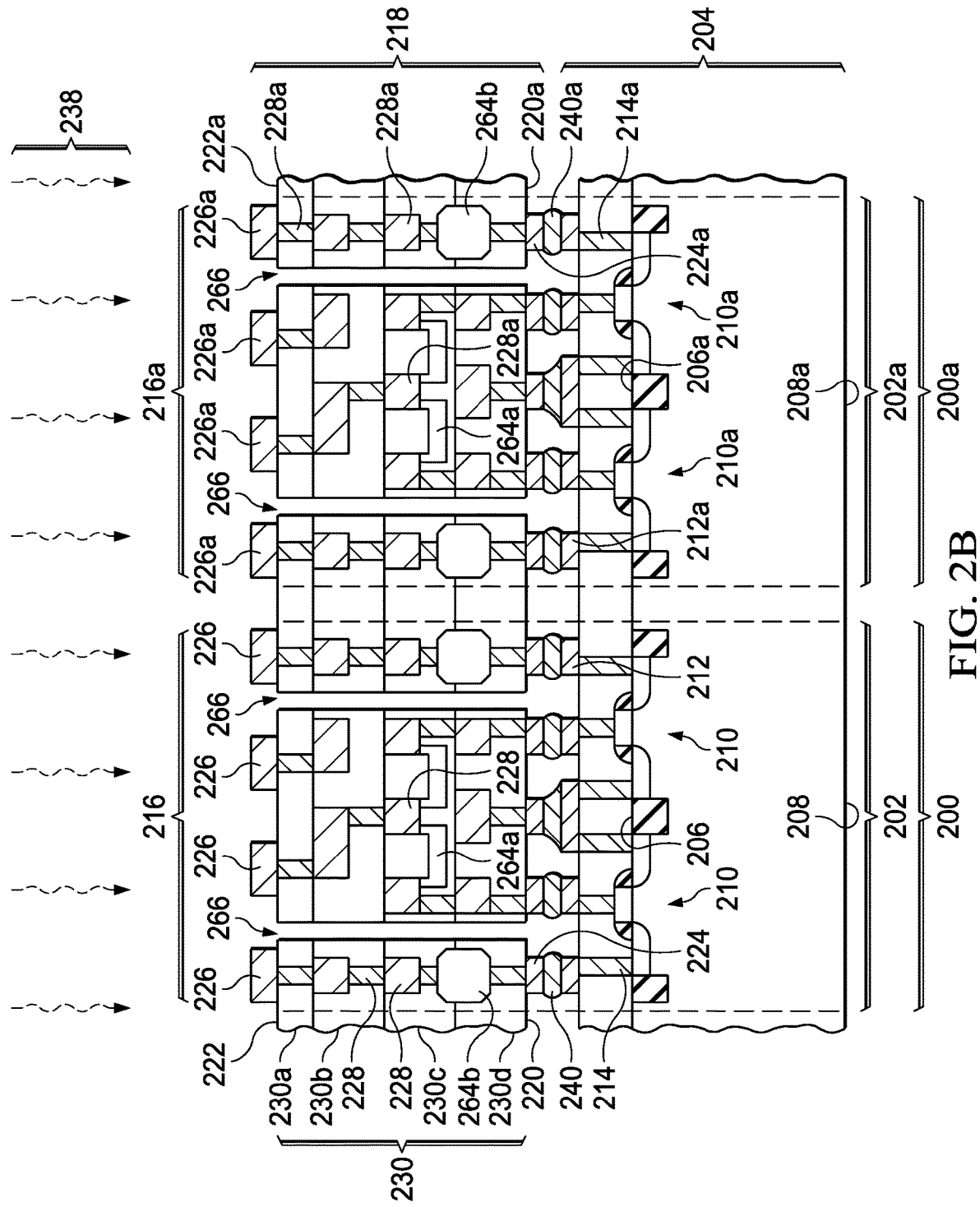

Referring to FIG. 2B, the interface lamina 218 is brought into contact with the wafer 204 through the connection bumps 268 and 268a, so that die attach leads 224 and 224a are aligned with the die terminals 212 and 212a, respectively. The connection bumps 268 and 268a of FIG. 2A contact the die attach leads 224 and 224a and contact the die terminals 212 and 212a, respectively.

The connection bumps 268 and 268a of FIG. 2A are heated by a heating process 238 which forms interface bonds 240 and 240a, respectively. The interface bonds 240 electrically couple the die attach leads 224 to the die terminals 212, and the interface bonds 240a electrically couple the die attach leads 224a to the die terminals 212a. In a version of this example in which the connection bumps 268 and 268a are implemented as solder bumps, the heating process 238 melts and reflows the solder in the solder bumps to form the interface bonds 240 and 240a. In a version of this example in which the connection bumps 268 and 268a include an electrically conductive adhesive, the heating process 238 cures the electrically conductive adhesive to form the interface bonds 240 and 240a.

Figure 2C:
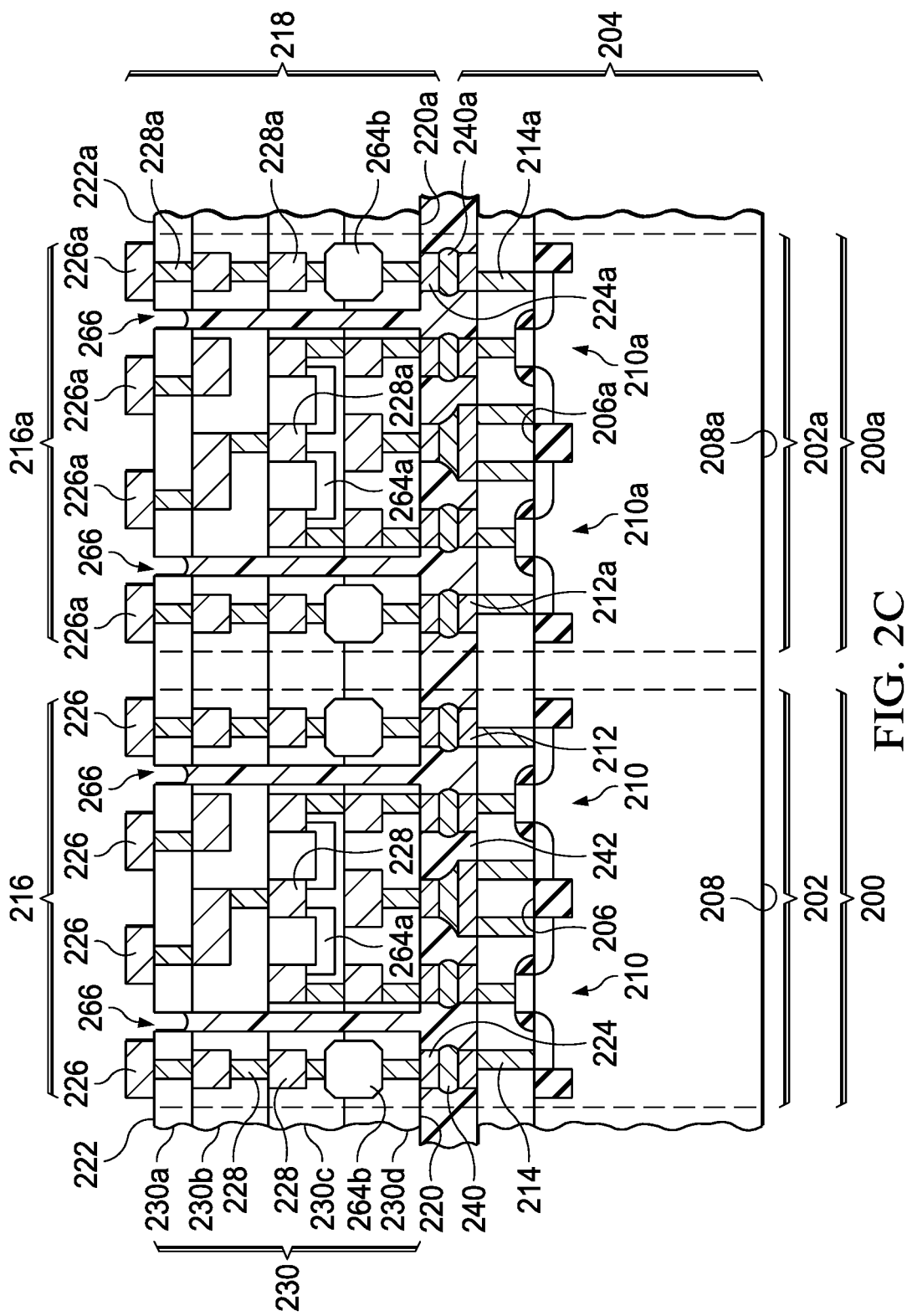

Referring to FIG. 2C, the fluid precursor is flowed through the access ports 266 and into a space between the wafer 204 and the interface lamina 218. The fluid precursor may include liquid polymer material such as epoxy, benzocyclobutene (BCB) or silicone. Alternatively, the fluid precursor may include an inorganic slurry. The fluid precursor is subsequently cured to form the interposer layer 242, extending from the die attach surfaces 220 and 220a of the interface lamina 218 to the terminal surfaces 206 and 206a of the wafer 204. The interposer layer 242 laterally surrounds the interface bonds 240 and 240a. The access ports 266 may advantageously enable flowing the fluid precursor into a space between the wafer 204 and the interface lamina 218 at a relatively low pressure to avoid damage to the components 210 and 210a, and to attain a consistent separation between the wafer 204 and the interface lamina 218.

Figure 2D:
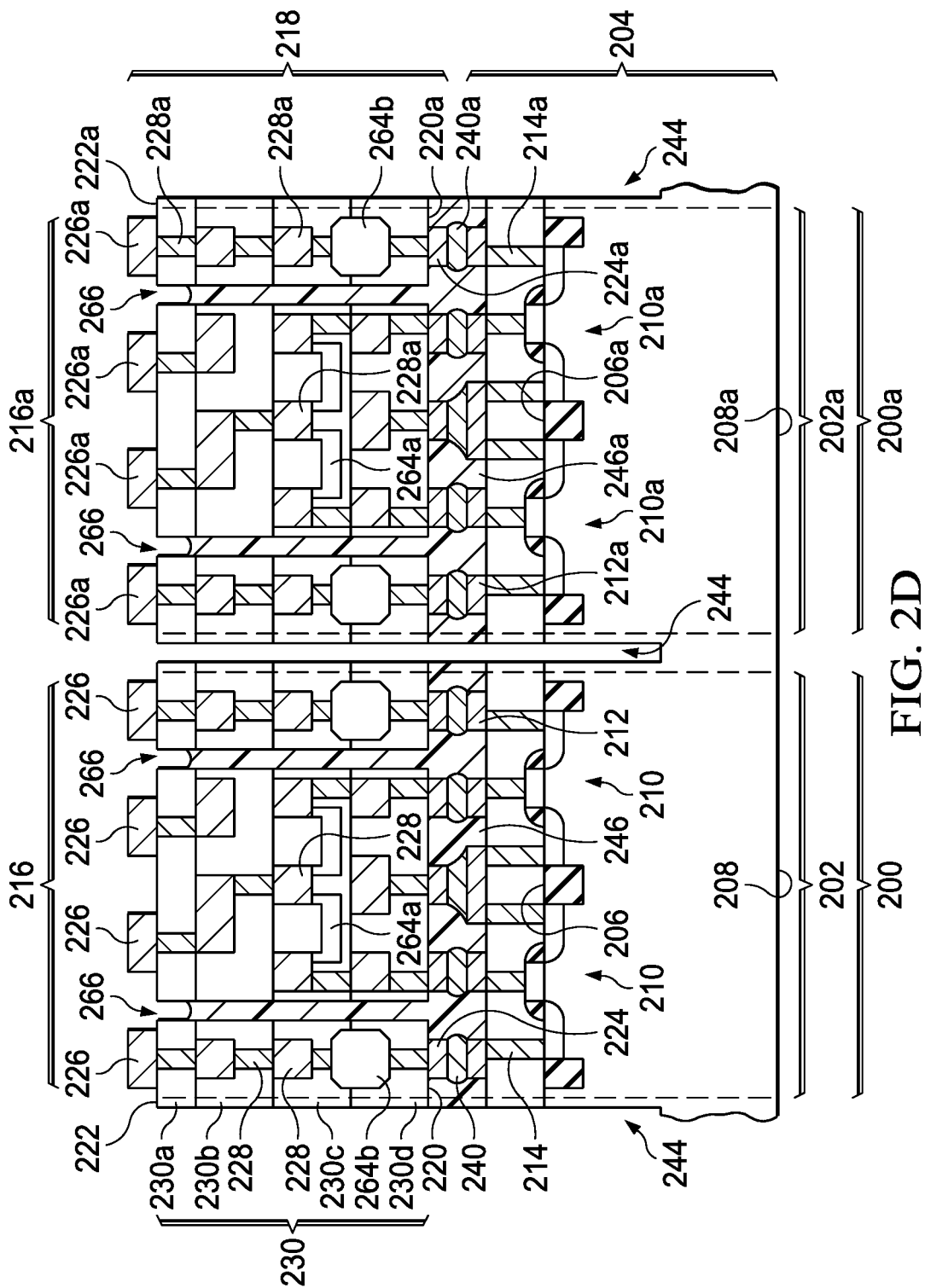

Referring to FIG. 2D, kerfs 244 are formed through the interface lamina 218, the interposer layer 242 of FIG. 2C, and partway through the wafer 204 around a lateral perimeter of the die 202, and around lateral perimeters of the additional die 202a. The kerfs 244 may be formed by any combination of a saw process, a laser ablation process, or a plasma etch process. The kerfs 244 may have widths of 20 microns to 100 microns, by way of example, and extend into the wafer 204 to a depth that is at least as much as a desired final thickness of the die 202 in the completed microelectronic device 200. Forming the kerfs 244 singulates the interface tile 216 from the interface lamina 218. Forming the kerfs 244 also singulates the interposer layer 242 to form an interposer 246 of the microelectronic device 200, and forms additional interposers 246a of the additional microelectronic devices 200a. The interposer 246 extends from the die attach surface 220 of the interface tile 216 to the terminal surface 206 of the die 202. Forming the kerfs 244 results in a lateral perimeter of the interface tile 216, a lateral perimeter of the interposer 246, and the lateral perimeter of the die 202 being aligned to each other.

Figure 2E:
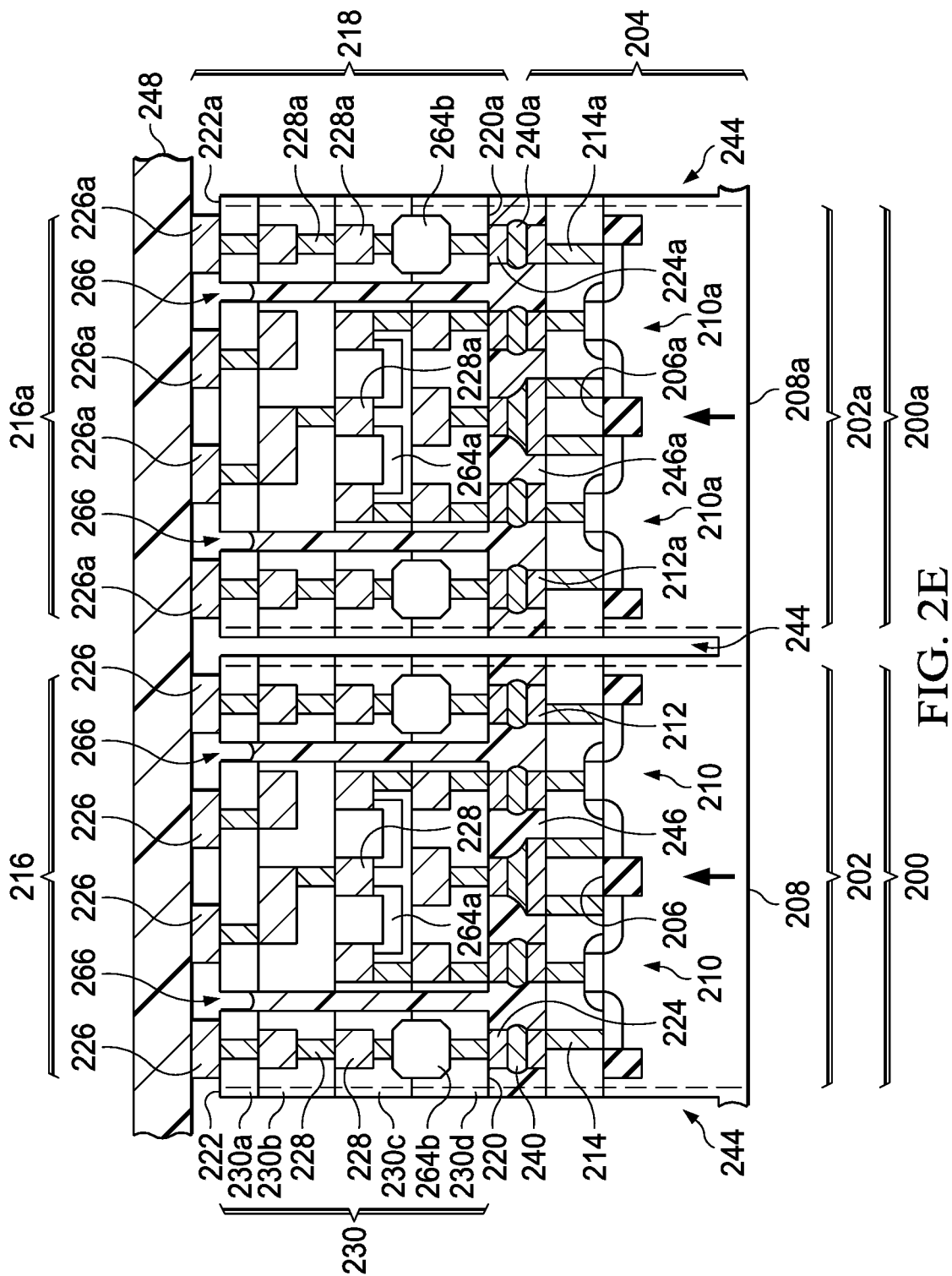

Referring to FIG. 2E, the interface lamina 218 is mounted on a carrier 248. Material is removed from the wafer 204 at the back surfaces 208 and 208a, until the kerfs 244 are exposed, singulating the die 202 from the additional die 202a. FIG. 2E depicts removal of the material from the wafer 204 partway to completion. The interface lamina 218 may remain mounted on the carrier 248 for subsequent process operations.

Figure 2F:
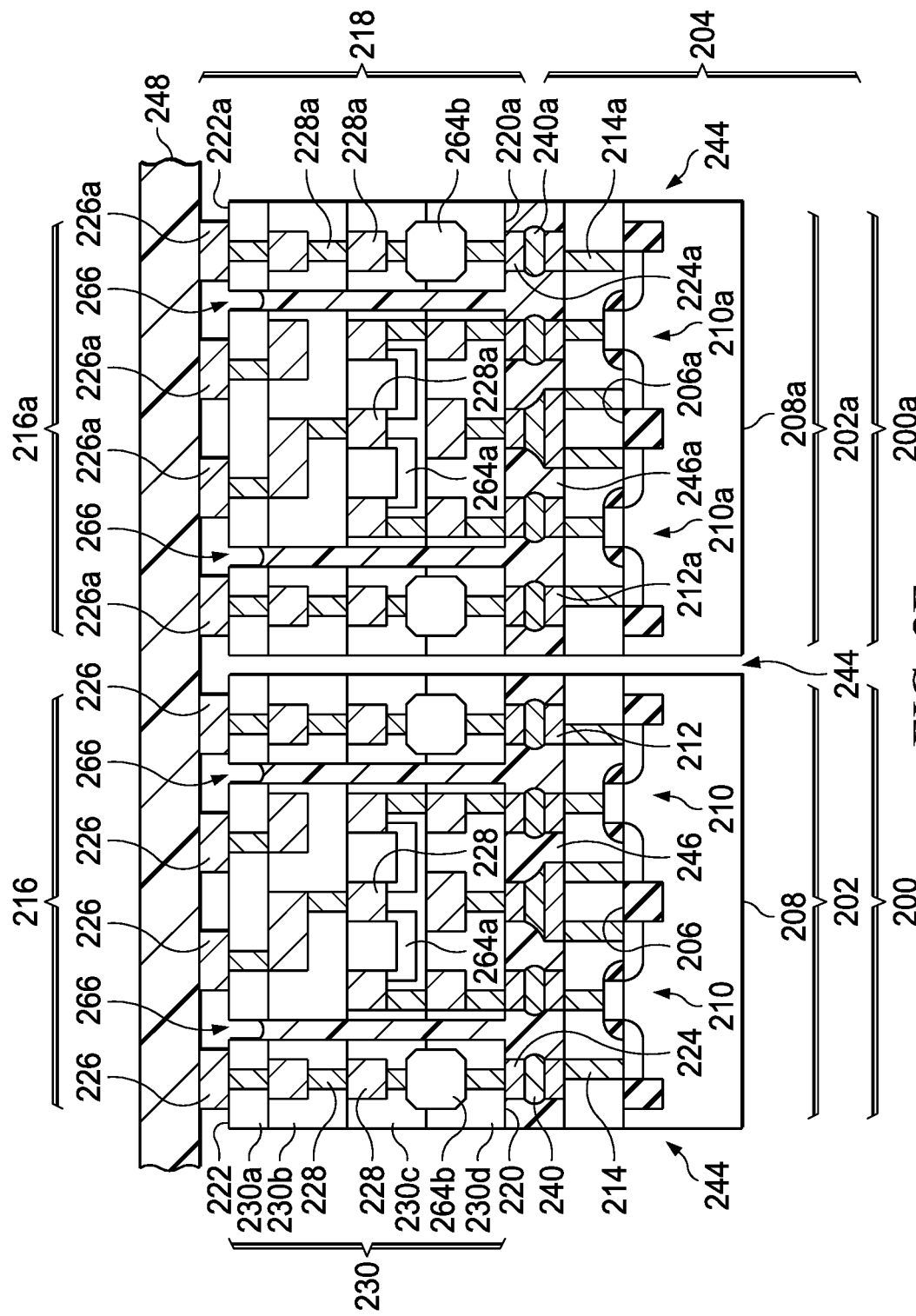

FIG. 2F depicts the microelectronic device 200 after removal of the material from the wafer 204 is completed. The microelectronic device 200 has been singulated from the additional microelectronic device 200a by removal of the material from the wafer 204 up to the kerfs 244. A thickness of the die 202, from the terminal surface 206 to the back surface 208, is less than 300 microns. The microelectronic device 200 and the additional microelectronic device 200a may be left on the carrier 248 for subsequent formation operations.

Figure 2G:
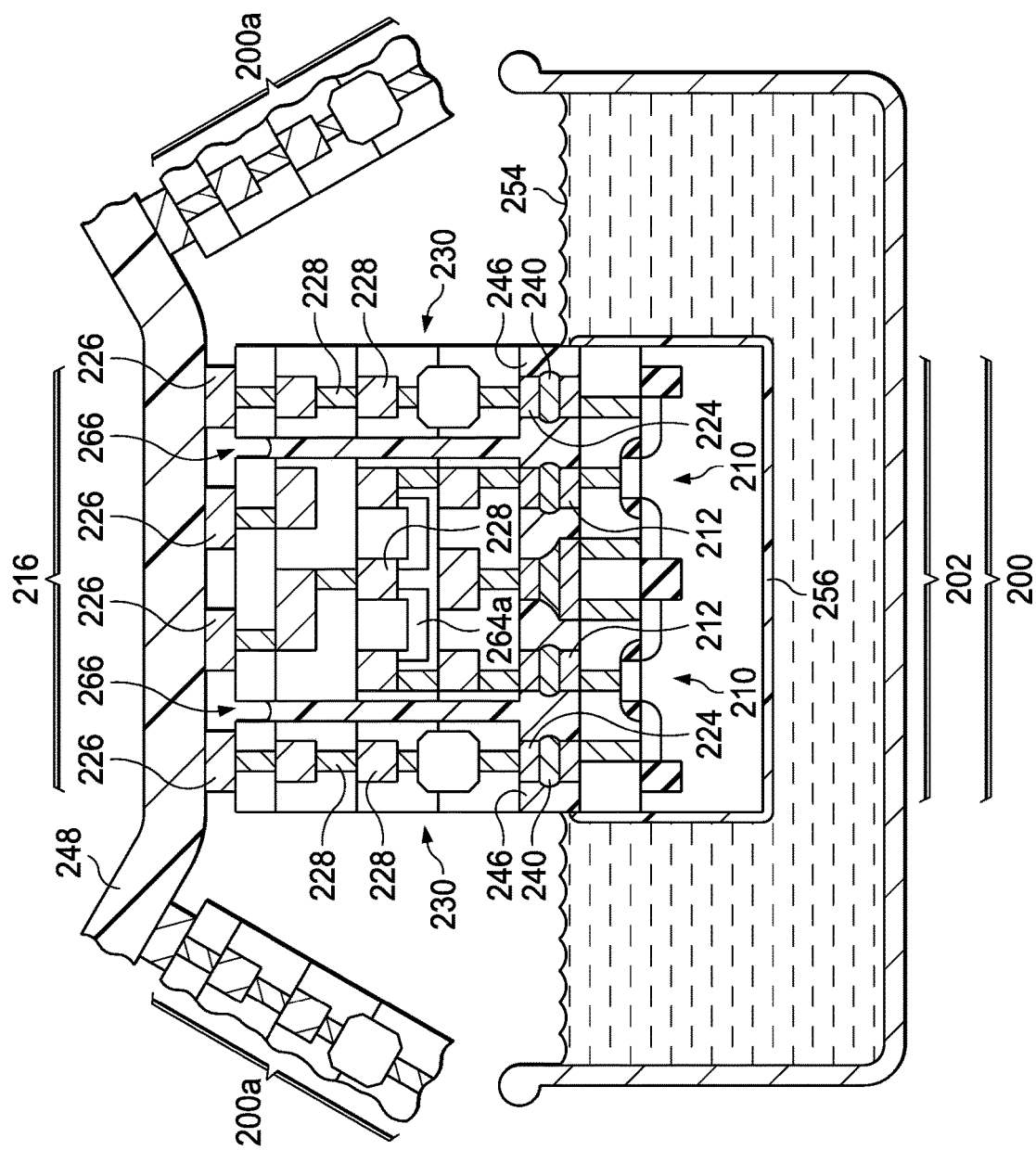

Referring to FIG. 2G, the die 202 is dipped in a coating ink 254. The microelectronic device 200 may be separated from the additional microelectronic devices 200a by flexing the carrier 248, as indicated in FIG. 2G, to facilitate dipping the die 202 in the coating ink 254. The coating ink 254 includes opaque, electrically non-conductive pigment which adheres to the die 202 to form a die coating 256 on the die 202. The die coating 256 may cover lateral sides of the die 202, extending partway onto the interface tile 216, as depicted in FIG. 2G.

Figure 2H:
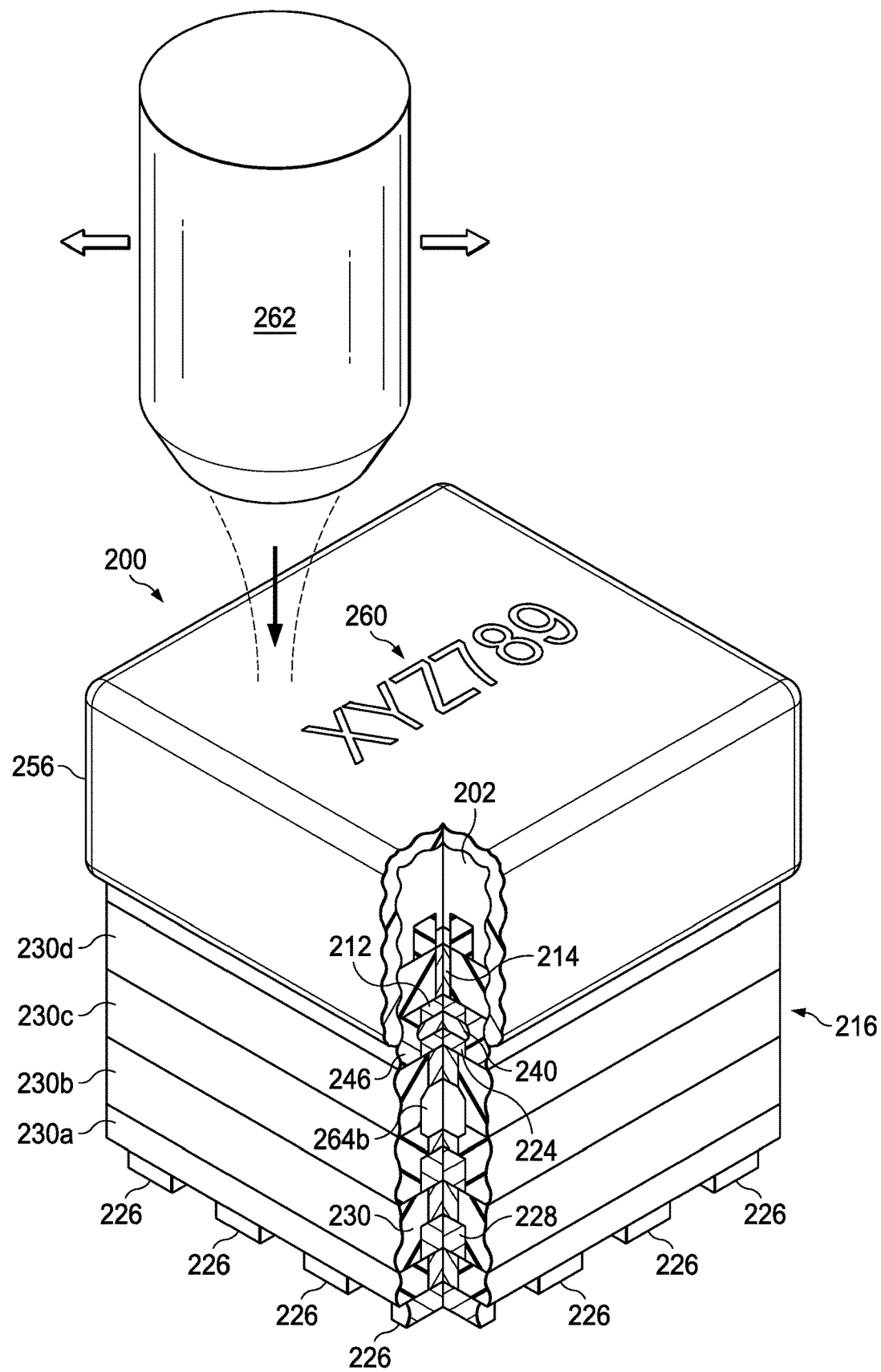

Referring to FIG. 2H, the microelectronic device 200 may be removed from the carrier 248 of FIG. 2G. The microelectronic device 200 may be symbolized by forming characters 260 on the die coating 256. The characters 260 may include alphanumeric characters, or may include other symbols indicating identity or status of the microelectronic device 200. The characters 260 may be formed by a symbolization apparatus 262, which may be implemented as a laser, or other marking device.

Having the CTE of the interface tile 216 greater than the CTE of the die 202 and less than $15 \times 10^{-6}/°K$, and having the thickness of the die 202 less than 300 microns, may advantageously reduce mechanical stress in the interface bonds 240 as disclosed in reference to the microelectronic device 100 of FIG. 1J.

Various features of the examples disclosed herein may be combined in other manifestations of example microelectronic devices. For example, the interface tile 116 FIG. 1A may have components such as resistors 264a and diodes 264b as disclosed in reference to FIG. 2A. The interface lamina 118 of FIG. 1A may be used with the method disclosed in reference to FIG. 2A through FIG. 2H. Similarly, the interface lamina 218 of FIG. 2A may be used with the method disclosed in reference to FIG. 1A through FIG. 1J.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
a die having a terminal surface, die terminals at the terminal surface, and a back surface located opposite from the terminal surface, wherein a thickness of the die, from the terminal surface to the back surface, is less than 300 microns;
an interface tile having a lamina structure with a die attach surface and an external surface located opposite from the die attach surface, the interface tile having interface leads at the die attach surface and having external leads at the external surface, the external leads being electrically coupled to the interface leads through the lamina structure;
interface bonds between the die and the interface tile, wherein the die terminals are electrically coupled to the interface leads through the interface bonds;
an interposer between the die and the interface tile, extending from the terminal surface of the die to the die attach surface of the interface tile, wherein a lateral perimeter of the die, a lateral perimeter of the interposer, and a lateral perimeter of the interface tile are aligned with each other; and
a die coating on the back surface and lateral surfaces of the die, the lateral surfaces extending from the terminal surface of the die to the back surface of the die.

2. The microelectronic device of claim 1, wherein a coefficient of thermal expansion (CTE) of the interface tile is greater than a CTE of the die and less than $15 \times 10^{-6}/°$ K.

3. The microelectronic device of claim 1, wherein:
an average CTE of the interface tile is greater than a CTE of the die and less than $10 \times 10^{-6}/°$ K;
a CTE of the interface tile at the die attach surface is less than the average CTE of the interface tile and greater than a CTE of the die; and
a CTE of the interface tile at the external surface is greater than the average CTE of the interface tile and less than $15 \times 10^{-6}/°$ K.

4. The microelectronic device of claim 1, wherein the interface tile includes a component selected from the group consisting of a resistor and a diode.

5. The microelectronic device of claim 1, wherein the lamina structure includes fiberglass reinforced polymer.

6. The microelectronic device of claim 1, wherein the interface bonds include solder.

7. The microelectronic device of claim 1, wherein the die terminals include pillars.

* * * * *